United States Patent
Bobba et al.

(10) Patent No.: US 6,784,689 B2
(45) Date of Patent: Aug. 31, 2004

(54) TRANSMISSION GATE BASED SIGNAL TRANSITION ACCELERATOR

(75) Inventors: Sudhakar Bobba, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 65 days.

(21) Appl. No.: 10/068,671

(22) Filed: Feb. 6, 2002

(65) Prior Publication Data

US 2003/0146773 A1 Aug. 7, 2003

(51) Int. Cl.[7] .................. H03K 17/16; H03K 19/003
(52) U.S. Cl. .................. 326/29; 326/113; 326/135; 327/170
(58) Field of Search .............. 326/17, 21, 29, 326/30, 62, 82, 86, 90, 113, 135; 327/108, 165, 170

(56) References Cited

U.S. PATENT DOCUMENTS 4,498,021 A * 2/1985 Uya ......................... 307/443
5,519,344 A * 5/1996 Proebsting ................. 327/108
5,767,700 A * 6/1998 Lee ........................... 326/86

* cited by examiner

Primary Examiner—Daniel Chang
(74) Attorney, Agent, or Firm—Osha & May L.L.P.

(57) ABSTRACT

A negative impedance device that accelerates signal transitions on a signal is provided. The negative impedance device is highly responsive to high to low and low to high transitions on the signal, and when one of these types of transitions begins to occur on the signal, the negative impedance device senses the transition and quickly drives the signal to the intended value before a point in time when the signal would have reached the intended value had the negative impedance device not been used. Further, a signal transition accelerator design that reduces signal rise and fall times is provided. Further, a method for accelerating a signal transition is provided.

47 Claims, 4 Drawing Sheets

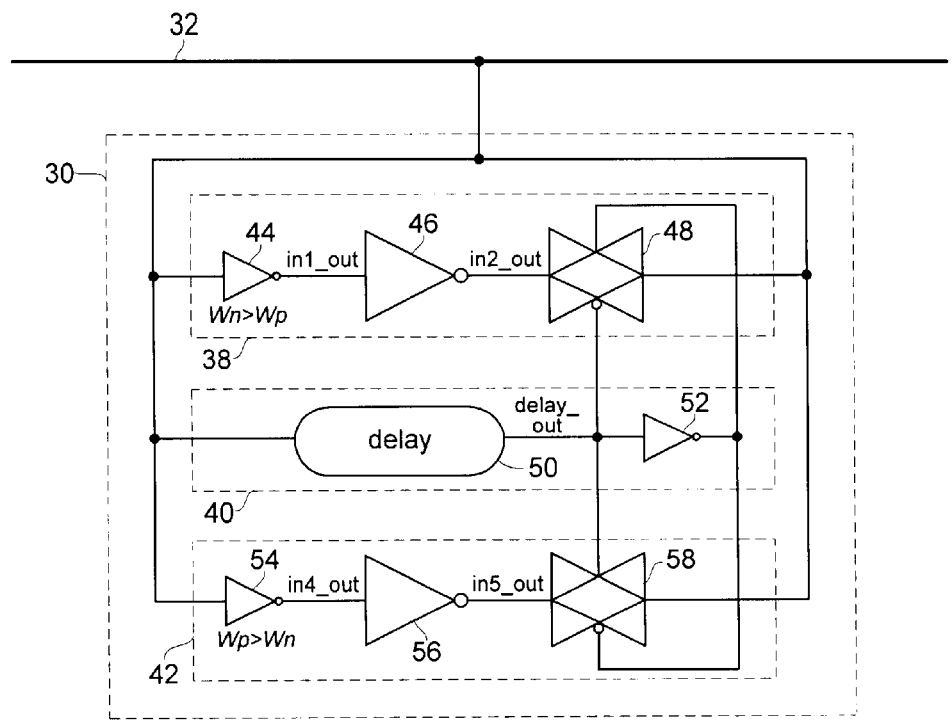
FIGURE 3c
FIGURE 3d FIGURE 3e

TRANSMISSION GATE BASED SIGNAL TRANSITION ACCELERATOR

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and signals, that are necessary for the transfer of data among the aforementioned components of the computer system (10).

The various computations and operations performed by the computer system are facilitated through the use of signals that provide electrical pathways for data to propagate between the various components of the computer system. A voltage value of a signal can typically transition from high to low and low to high. However, due to the sizes and complexities of modern integrated circuits, signals are often routed in a manner where data on a particular signal must propagate a relatively long distance to get from one element in the integrated circuit to another element in the integrated circuit. Such long propagation distances may lead to signal transition attenuation, i.e., a loss of signal integrity. Further, various impedance-procuring effects across an integrated circuit, such as noise, electromagnetic interference, cross-coupling capacitance (i.e., "crosstalk" or "switching noise"), process variations, voltage variations, and resistor-capacitor loads, may also adversely affect signal integrity.

FIG. 2 shows a low to high signal transition (20) and a high to low signal transition (22) during a typical 'signal transition period,' where the signal transition period is defined as the period it takes for a signal transition to complete. More specifically, the switching speed from a high state to a low state is defined as a signal's fall time and the switching speed from a low state to a high state is defined as a signal's rise time. When a signal transition period of a signal is too long, components dependent on that signal may be adversely affected. For instance, long signal transition periods may lead to, among other things, skew, functional mistiming, synchronous function degradation, inaccurate operation, and system malfunction. Thus, especially as signal frequencies continue to increase, there is a need for a design that decreases a signal transition period of a signal, or, in other words, a design that accelerates signal transitions on a signal, thereby decreasing signal rise and fall times.

SUMMARY OF INVENTION

According to one aspect of the present invention, in an integrated circuit that has a signal path to which a negative impedance device is operatively connected, the negative impedance device comprises a pull-up stage having an output responsive to a low to high transition on the signal path, a pull-down stage having an output responsive to a high to low transition on the signal path, and a reset stage that activates at least one of the pull-up stage and the pull-down stage after a transition occurs.

According to another aspect, in an integrated circuit that has a signal to which a negative impedance device is operatively connected, the negative impedance device comprises pull-up means for accelerating a low to high transition on the signal, pull-down means for accelerating a high to low transition on the signal, and reset means for activating at least one of the pull-up means and the pull-down means after a transition occurs.

According to another aspect, a signal transition accelerator comprises a pull-up stage having an output responsive to a low to high transition on a signal path; a pull-down stage having an output responsive to a high to low transition on the signal path; and a reset stage that activates the pull-up stage after the high to low transition, where the pull-up stage responds more quickly to the low to high transition than does the pull-down stage.

According to another aspect, a method for accelerating a transition of a signal on a signal path comprises inputting the signal to a pull-up stage, where an output signal of the pull-up stage is operatively coupled to the signal path after a high to low transition on the signal; and inputting the signal to a pull-down stage, where an output signal of the pull-down stage is operatively coupled to the signal path after a low to high transition on the signal, and where the pull-up stage outputs an accelerated low to high transition when the signal begins to transition from low to high.

According to another aspect, a method for accelerating a transition of a signal on a signal path comprises activating a pull-up stage in response to a high to low transition on the signal, detecting a beginning of a low to high transition on the signal, and accelerating the low to high transition on the signal when the beginning of the low to high transition is detected.

Other aspects and advantages of the invention will be apparent from the following description and the appended claims.

BRIEF DESCRIPTION OF DRAWINGS

FIG. 3c shows a circuit diagram in accordance with the embodiment shown in FIG. 3a.

FIG. 3d shows a circuit diagram in accordance with the embodiment shown in FIG. 3c.

FIG. 3e shows a circuit diagram in accordance with the embodiment shown in FIG. 3c.

DETAILED DESCRIPTION

Embodiments of the present invention relate to a negative impedance device that decreases a signal transition period of a signal. Embodiments of the present invention further relate to a signal transition accelerator that speeds up a signal transition. Embodiments of the present invention further relate to a transmission gate based device that decreases signal rise and fall times. Embodiments of the present invention further relate to a method for decreasing a signal transition period of a signal. Embodiments of the present invention further relate to a method for accelerating a signal transition.

More particularly, embodiments of the present invention relate to a transmission gate based negative impedance device that is highly responsive to high to low and low to high transitions on a signal. When one of these types of transitions begin to occur on the signal, the negative impedance device senses the transition and quickly drives the signal to the intended value before a point in time when the signal would have reached the intended value had the negative impedance device not been used.

Figure 1:
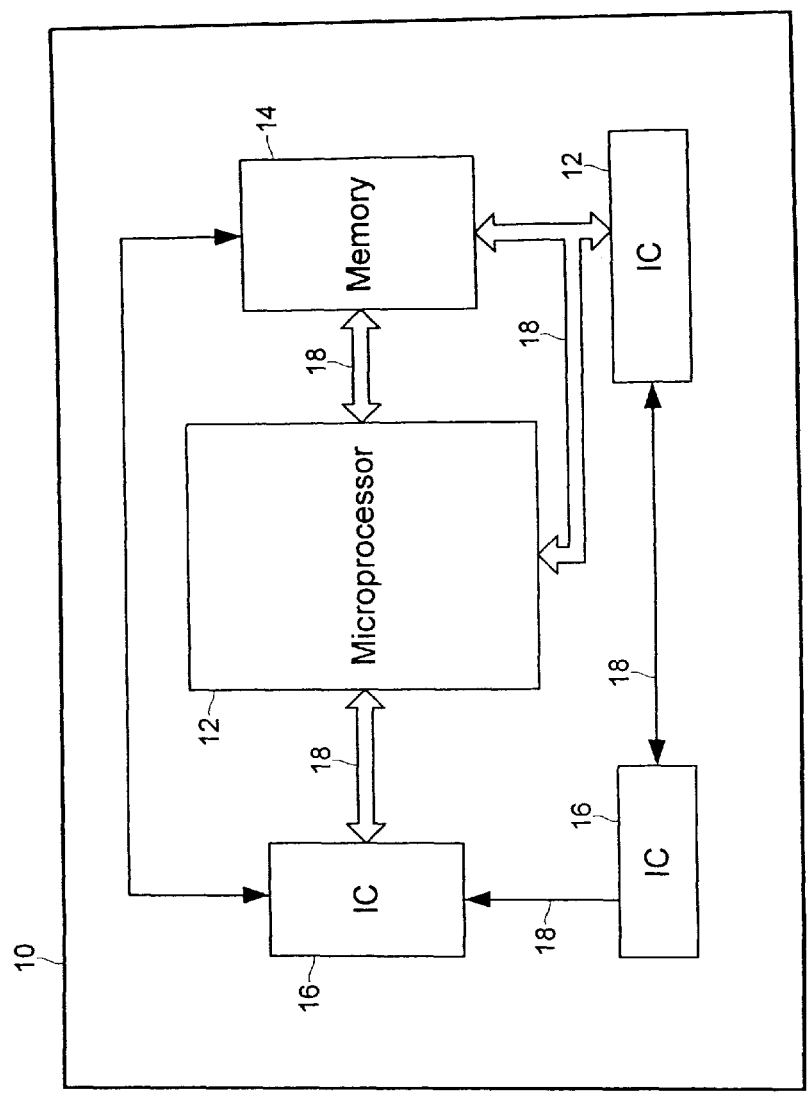
FIG. 1 shows a typical computer system.
Figure 2:
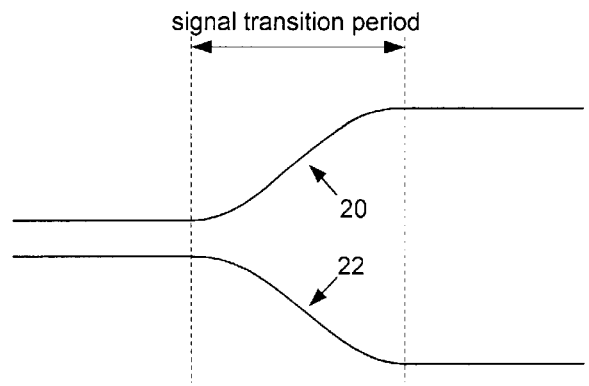
FIG. 2 shows signal transitions during a typical signal transition period.
Figure 3A:
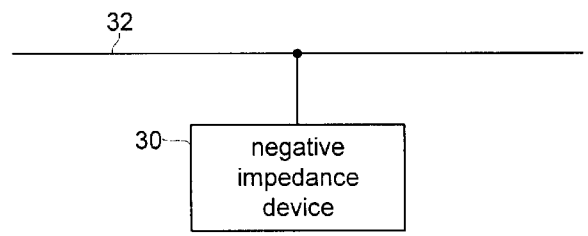
FIG. 3a shows a block diagram in accordance with an embodiment of the present invention.
Figure 3B:
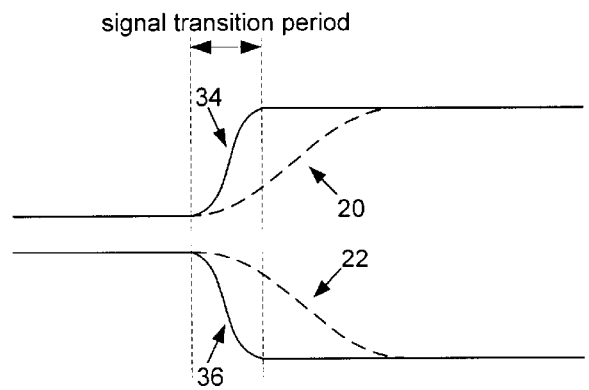
FIG. 3b shows signal transitions during a signal transition period in accordance with an embodiment of the present invention.

FIG. 3a shows a block diagram in accordance with an embodiment of the present invention. In FIG. 3a, a negative impedance device (30) is operatively connected to a point on a signal (32). The negative impedance device (30) counteracts impedance on the signal (32) such that some or all of the effects of the impedance on the signal (32) are compensated for or cancelled out by the negative impedance provided by the negative impedance device (30). This results in a signal transition period that is shorter relative to a case where the negative impedance device (30) is not used. For example, in FIG. 3b, due to the presence of the negative impedance device (30) on the signal (32), a low to high transition (34) occurs more quickly than the typical low to high transition (20) and a high to low transition (36) occurs more quickly than the typical high to low transition (22).

FIG. 3c shows a circuit diagram in accordance with the embodiment of the negative impedance device (30) shown in FIG. 3a. In FIG. 3c, the negative impedance device (30) has a pull-up stage (38), a reset stage (40), and a pull-down stage (42). The pull-up stage (38) is formed by a first inverter (44), a second inverter (46), and a first transmission gate (48). The reset stage (40) is formed by a delay element (50) and a third inverter (52). The pull-down stage (42) is formed by a fourth inverter (54), a fifth inverter (56), and a second transmission gate (58).

In the pull-up stage (38), an input to the first inverter (44) is operatively connected to the signal (32). The first inverter (44) is selectively sized such that the first inverter (44) responds more quickly, from a conduction standpoint, to low to high transitions than to high to low transitions. As shown in FIG. 3d, this behavior is realized by skewing a width of an n-type device (47) in the first inverter (44) to be larger than a width of a p-type device (45) in the first inverter (44), i.e., Wn>Wp, where Wn is the width of the n-type device (47) and Wp is the width of the p-type device (45). Such sizing causes the first inverter (44) to more quickly output low when the signal (32) begins to transition from low to high than output high when the signal (32) begins to transition from high to low.

Referring back to FIG. 3c, the first inverter (44) outputs to the second inverter (46), which has a relatively high drive strength in order to strongly drive its output, i.e., provide a sharp output transition, to the first transmission gate (48). The first transmission gate (48) is controlled by complementary signals received from the reset stage (40).

In the pull-down stage (42), an input to the fourth inverter (54) is operatively connected to the signal (32). The fourth inverter (54) is selectively sized such that the fourth inverter (54) responds more quickly, from a conduction standpoint, to high to low transitions than to low to high transitions. As shown in FIG. 3e, this behavior is realized by skewing a width of a p-type device (55) in the fourth inverter (54) to be larger than a width of an n-type device (57) in the fourth inverter (54), i.e., Wp>Wn, where Wp is the width of the p-type device (55) and Wn is the width of the n-type device (57). Such sizing causes the fourth inverter (54) to more quickly output low when the signal (32) begins to transition from high to low than output low when the signal (32) begins to transition from low to high.

Referring back to FIG. 3c, the fourth inverter (54) outputs to the fifth inverter (56), which has a relatively high drive strength in order to strongly drive its output, i.e., provide a sharp output transition, to the second transmission gate (58). The second transmission gate (58) is controlled by complementary signals received from the reset stage (40).

In the reset stage (40), an input to the delay element (50) is operatively connected to the signal (32). The delay element (50) outputs a delayed signal to the first transmission gate (48), the second transmission gate (58), and the third inverter (52). The delayed signal output from the delay element (50) is used as a control signal input to the first and second transmission gates (48, 58). The third inverter (52) outputs an inverse of the delayed signal output from the delay element (50). The signal output from the third inverter (52) is used as a complementary control signal input to the first and second transmission gates (48, 58).

Those skilled in the art will appreciate that, in other embodiments, buffers may be used instead of the first, second, fourth, and fifth inverters (44, 46, 54, 56). In such embodiments, a buffer used in place of the first inverter (44) is selectively sized in order to be respond more quickly, from a conduction standpoint, to low to high transitions than high to low transitions, i.e., Wn>Wp. Alternatively, a buffer used in place of the fourth inverter (54) is selectively sized in order to respond more quickly, from a conduction standpoint, to low to high transitions than high to low transitions, i.e., Wp>Wn. Further, the buffers used in place of the second and fifth inverters (46, 56) have relatively high drive strengths in order to strongly drive their respective outputs, i.e., provide sharp output transitions, to the first and second transmission gates (48, 58), respectively.

Figure 3F:
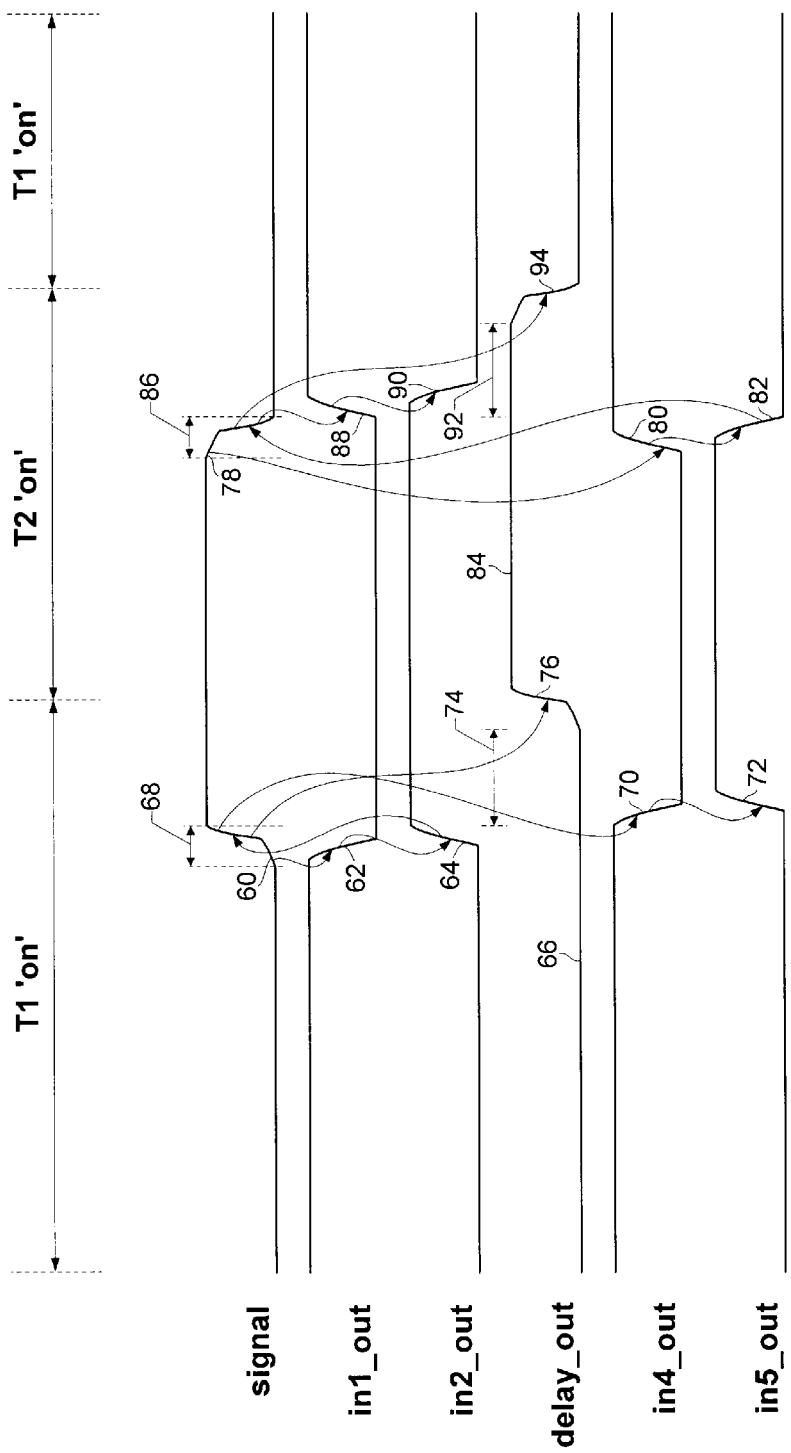
FIG. 3f shows a timing diagram in accordance with the embodiment shown in FIG. 3c.

FIG. 3f shows a timing diagram in accordance with the embodiment shown in FIG. 3c. When the signal (32) (represented in FIG. 3f as signal) starts to transition from low to high (60), the first inverter (44) quickly outputs low (62) to the second inverter (46), which, in turn, outputs high (64) to the first transmission gate (48) (the output of the first inverter (44) is represented in FIG. 3c as in1_out and the output of the second inverter (46) is represented in FIG. 3f as in2_out). Because the signal (32) was low before the transition from low to high (60), the delay element (50), which provides some finite delay (74), outputs low (66) during and for some time after the signal (32) transitions from low to high (60). The low output (66) from the delay element (50) and the corresponding high output from the third inverter (52) keep the first transmission gate (48) 'on' (represented in FIG. 3f as T1 'on'). Because the first transmission gate (48) is 'on' during the transition of the signal (32) from low to high (60), the strong low to high output transition (64) of the second inverter (46) gets coupled to the signal (32) such that the transition of the second inverter's (46) output from low to high is mirrored on the signal (32). Thus, those skilled in the art will appreciate that the pull-up stage (38) of the negative impedance device (30) effectively accelerates a low to high transition on the signal (32). The acceleration of the low to high transition (60) on the signal (32) leads to a relatively short signal rise time (68).

Further, during a later part of the low to high transition (60) on the signal (32), the fourth inverter (54) outputs low (70) to the fifth inverter (58), which, in turn, outputs high (72) to the second transmission gate (58) (the output of the fourth inverter (54) is represented in FIG. 3f as in4_out and the output of the fifth inverter (56) is represented in FIG. 3f as in5_out). However, because the low output (66) from the delay element (50) and the corresponding high output from the third inverter (52) keep the second transmission gate (58) 'off' (represented in FIG. 3f as T1 'off'), the strong low to high output transition (64) of the fifth inverter (56) does not get coupled to the signal (32) during the transition of the signal (32) from low to high (60).

Those skilled in the art will note that, with respect to the low to high transition (60) of the signal (32), the output of the fourth inverter (54) goes low (70) some time after the output of the first inverter (44) goes low (62). This is due to the fact that the fourth inverter (54) is sized to respond more quickly to high to low transitions at its input than to low to high transitions at its input, whereas the first inverter (44) is sized to respond more quickly to low to high transitions at its input than to high to low transitions at its input.

After the signal (32) transitions from low to high (60) and after some delay (74) contributed by the delay element (50), the delay element (50) outputs high (76) (the output of the delay element (50) is represented in FIG. 3f as delay_out). The high output (76) from the delay element (50) and the corresponding low output from the third inverter (52) to switch the first transmission gate (48) 'off' and the second transmission gate (58) 'on.' In effect, the delay (74) provided by the delay element (50) helps activate the pull-down stage (42) for the next transition on the signal (32), which, if any, must be a high to low transition.

When the signal (32) starts to transition from high to low (78), the fourth inverter (54) quickly outputs high (80) to the fifth inverter (56), which, in turn, outputs low (82) to the second transmission gate (58). Because the signal (32) was high before the transition from high to low (78), the delay element (50), which provides some finite delay (92), outputs high (84) during and for some time after the signal (32) transitions from high to low (78). The high output (84) from the delay element (50) and the corresponding low output from the third inverter (52) keep the second transmission gate (58) 'on'. Because the second transmission gate (58) is 'on' during the transition of the signal (32) from high to low (78), the strong high to low output transition (82) of the fifth inverter (56) gets coupled to the signal (32) such that the transition of the fifth inverter's (56) output from high to low is mirrored on the signal (32). Thus, those skilled in the art will appreciate that the pull-down stage (42) of the negative impedance device (30) effectively accelerates a high to low transition on the signal (32). The acceleration of the high to low transition (78) on the signal (32) leads to a relatively short signal fall time (86).

Further, during a later part of the high to low transition (78) on the signal (32), the first inverter (44) outputs high (88) to the second inverter (46), which, in turn, outputs low (90) to the first transmission gate (48). However, because the high output (84) from the delay element (50) and the corresponding low output from the third inverter (52) keep the first transmission gate (58) 'off,' the strong high to low output transition (90) of the second inverter (46) does not get coupled to the signal (32) during the transition of the signal (32) from high to low (78).

Those skilled in the art will note that, with respect to the high to low transition (78) of the signal (32), the output of the first inverter (44) goes high (88) some time after the output of the fourth inverter (54) goes high (80). This is due to the fact that the first inverter (44) is sized to respond more quickly to low to high transitions at its input than to high to low transitions at its input, whereas the fourth inverter (54) is sized to respond more quickly to high to low transitions at its input than to low to high transitions at its input.

After the signal (32) transitions from high to low (78) and after some delay (92) contributed by the delay element (50), the delay element (50) outputs low (94). The low output (94) from the delay element (50) and the corresponding high output from the third inverter (52) switch the second transmission gate (58) 'off' and the first transmission gate (48) 'on.' In effect, the delay (90) provided by the delay element (50) helps activate the pull-up stage (38) for the next transition on the signal (32), which, if any, must be a low to high transition.

Advantages of the present invention may include one or more of the following. In some embodiments, because a negative impedance device effectively decreases signal transition times, signal integrity is improved; thus, system performance is also improved.

In some embodiments, because a negative impedance device that accelerates signal transitions compensates for impedance on a signal path, a designer does not need to make exhaustive attempts to reduce impedance causing adverse behavior on the signal.

In some embodiments, because a signal transition accelerator inputs a signal and has outputs that are operatively coupled to the signal, the signal transition accelerator behaves as a signal driver and increases the drive strength on the signal.

In some embodiments, because a negative impedance device may be used to accelerate signal transitions along a signal path, the slope of a signal waveform is accordingly reduced; thereby reducing the short-circuit power dissipation in subsequent circuitry.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a signal path to which a negative impedance device is operatively connected, the negative impedance device comprising:
    a pull-up stage having an input and an output operatively connected to the signal path;
    a pull-down stage having an input and an output operatively connected to the signal path; and
    a reset stage having an input operatively connected to the signal path,
    wherein the pull-up stage is arranged to be active in advance of and during a low to high transition on the signal path, and wherein the pull-down stage is arranged to be active in advance of and during a high to low transition on the signal path.

2. The integrated circuit of claim 1, wherein the reset stage activates the pull-up stage after the high to low transition.

3. The integrated circuit of claim 1, wherein the reset stage activates the pull-down stage after the low to high transition.

4. The integrated circuit of claim 1, wherein the reset stage deactivates the pull-up stage after the low to high transition.

5. The integrated circuit of claim 1, wherein the reset stage deactivates the pull-down stage after the high to low transition.

6. The integrated circuit of claim 1, wherein the pull-up stage responds more quickly to the low to high transition than does the pull-down stage.

7. The integrated circuit of claim 1, wherein the pull-down stage responds more quickly to the high to low transition than does the pull-up stage.

8. The integrated circuit of claim 1, the pull-up stage comprising:
   a first logic element having a p-type device and an n-type device, wherein the first logic element has an input operatively connected to the signal path;
   a second logic element that outputs a signal based on an output signal from the first logic element; and
   a transmission gate that couples the output signal from the second logic element to the signal path depending on the reset stage.

9. The integrated circuit of claim 8, wherein a width of the n-type device is greater than a width of the p-type device.

10. The integrated circuit of claim 8, wherein the first and second logic elements are inverters.

11. The integrated circuit of claim 8, wherein the first and second logic elements are buffers.

12. The integrated circuit of claim 1, the pull-down stage comprising:
   a first logic element having a p-type device and an n-type device, wherein the first logic element has an input operatively connected to the signal path;
   a second logic element that outputs a signal based on an output signal from the first logic element; and
   a transmission gate that couples the output signal from the second logic element to the signal path depending on the reset stage.

13. The integrated circuit of claim 12, wherein a width of the p-type device is greater than a width of the n-type device.

14. The integrated circuit of claim 12, wherein the first and second logic elements are inverters.

15. The integrated circuit of claim 12, wherein the first and second logic elements are buffers.

16. The integrated circuit of claim 1, the reset stage comprising:
   a delay element that has an input operatively connected to the signal path; and
   a logic element that outputs a signal based on an output signal from the delay element,
   wherein the output signal from the delay element and the output signal from the logic element control a first transmission gate in the pull-up stage and a second transmission gate in the pull-down stage.

17. The integrated circuit of claim 16, wherein the output signal from the delay element and the output signal from the logic element are complementary.

18. An integrated circuit having a signal to which a negative impedance device is operatively connected, the negative impedance device comprising:
   pull-up means for accelerating a low to high transition on the signal;
   pull-down means for accelerating a high to low transition on the signal; and
   reset means for activating at least one of the pull-up means and the pull-down means after a transition occurs,
   wherein the pull-up means is arranged to be active in advance of and during the low to high transition, and wherein the pull-down means is arranged to be active in advance of and during the high to low transition.

19. A signal transition accelerator, comprising:
   a pull-up stage having an output responsive to a low to high transition on a signal path, wherein the pull-up stage is active in advance of and during the low to high transition;
   a pull-down stage having an output responsive to a high to low transition on the signal path, wherein the pull-down stage is active in advance of and during the high to low transition; and
   a reset stage that activates the pull-up stage after the high to low transition,
   wherein the pull-up stage responds more quickly to the low to high transition than does the pull-down stage.

20. The signal transition accelerator of claim 19, wherein the pull-down stage responds more quickly to the high to low transition than does the pull-up stage.

21. The signal transition accelerator of claim 19, wherein the reset stage activates the pull-down stage after the low to high transition.

22. The signal transition accelerator of claim 19, wherein the reset stage deactivates the pull-up stage after the low to high transition.

23. The signal transition accelerator of claim 19, wherein the reset stage deactivates the pull-down stage after the high to low transition.

24. The signal transition accelerator of claim 19, the pull-up stage comprising:
   a first logic element having a p-type device and an n-type device, wherein the first logic element has an input operatively connected to the signal path;
   a second logic element that outputs a signal based on an output signal from the first logic element; and
   a transmission gate that couples the output signal from the second logic element to the signal path depending on the reset stage.

25. The signal transition accelerator of claim 24, wherein a width of the n-type device is greater than a width of the p-type device.

26. The signal transition accelerator of claim 19, the pull-down stage comprising:
   a first logic element having a p-type device and an n-type device, wherein the first logic element has an input operatively connected to the signal path;
   a second logic element that outputs a signal based on an output signal from the first logic element; and
   a transmission gate that couples the output signal from the second logic element to the signal path depending on the reset stage.

27. The signal transition accelerator of claim 26, wherein a width of the p-type device is greater than a width of the n-type device.

28. The signal transition accelerator of claim 19, the reset stage comprising:
   a delay element that has an input operatively connected to the signal path; and
   a logic element that outputs a signal based on an output signal from the delay element,
   wherein the output signal from the delay element and the output signal from the logic element control a first transmission gate in the pull-up stage and a second transmission gate in the pull-down stage.

29. The signal transition accelerator of claim 28, wherein the output signal from the delay element and the output signal from the logic element are complementary.

30. A method for accelerating a transition of a signal on a signal path, comprising:
   inputting the signal to a pull-up stage, wherein an output signal of the pull-up stage is responsive to the signal path in advance of and during a low to high transition on the signal; and
   inputting the signal to a pull-down stage, wherein an output signal of the pull-down stage is responsive to the signal path in advance of and during a high to low transition on the signal, wherein the pull-up stage outputs an accelerated low to high transition when the signal begins to transition from low to high.

31. The method of claim 30, wherein the pull-down stage outputs an accelerated high to low transition when the signal begins to transition from high to low.

32. The method of claim 30, further comprising:

activating the pull-up stage after the high to low transition; and deactivating the pull-down stage after the high to low transition.

33. The method of claim 32, wherein activating the pull-up stage comprises switching on a transmission gate in the pull-up stage, and wherein deactivating the pull-down stage comprises switching off a transmission gate in the pull-down stage.

34. The method of claim 33, wherein activating the pull-up stage comprises:

inputting the signal to a delay element having an amount of delay; and inputting an output signal from the delay element to a logic element that outputs a signal based on the output signal from the delay element, wherein the output signal from the delay element and the output signal from the logic element control the transmission gate in the pull-up stage.

35. The method of claim 30, further comprising:

activating the pull-down stage after the low to high transition; and deactivating the pull-up stage after the low to high transition.

36. The method of claim 35, wherein activating the pull-down stage comprises switching on a transmission gate in the pull-down stage, and wherein deactivating the pull-up stage comprises switching off a transmission gate in the pull-up stage.

37. The method of claim 36, wherein activating the pull-down stage comprises:

inputting the signal to a delay element having an amount of delay; and inputting an output signal from the delay element to a logic element that outputs a signal based on the output signal from the delay element, wherein the output signal from the delay element and the output signal from the logic element control the transmission gate in the pull-down stage.

38. The method of claim 30, wherein the pull-up stage responds more quickly to the low to high transition than does the pull-down stage.

39. The method of claim 30, wherein the pull-down stage responds more quickly to the high to low transition than does the pull-down stage.

40. The method of claim 30, further comprising:

inputting the signal to a first logic element in the pull-up stage, wherein the first logic element comprises an n-type device and a p-type device;

inputting an output signal from the first logic element to a second logic element, wherein the second logic element outputs a signal to a transmission gate controlled by a reset stage.

41. The method of claim 40, wherein a width of the n-type device is greater than a width of the p-type device.

42. The method of claim 30, further comprising:

inputting the signal to a first logic element in the pull-down stage, wherein the first logic element comprises an n-type device and a p-type device;

inputting an output signal from the first logic element to a second logic element, wherein the second logic element outputs a signal to a transmission gate controlled by a reset stage.

43. The method of claim 42, wherein a width of the p-type device is greater than a width of the n-type device.

44. A method for accelerating a transition of a signal on a signal path, comprising:

activating a pull-up stage in advance of and during a low to high transition on the signal;

detecting a beginning of the low to high transition on the signal; and accelerating the low to high transition on the signal when the beginning of the low to high transition is detected.

45. The method of claim 44, further comprising deactivating a pull-down stage when activating the pull-up stage.

46. The method of claim 45, further comprising:

activating the pull-down stage in response to the low to high transition;

detecting a beginning of a high to low transition on the signal; and accelerating the high to low transition on the signal when the beginning of the high to low transition is detected.

47. The method of claim 46, further comprising deactivating the pull-up stage when activating the pull-down stage.

* * * * *